United States Patent
Fujimoto

(10) Patent No.: US 11,796,896 B2
(45) Date of Patent: Oct. 24, 2023

(54) VIBRATION DEVICE AND OPTICAL DETECTION DEVICE

(71) Applicant: Murata Manufacturing Co., Ltd., Nagaokakyo (JP)

(72) Inventor: Katsumi Fujimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 664 days.

(21) Appl. No.: 16/999,106

(22) Filed: Aug. 21, 2020

(65) Prior Publication Data

US 2020/0379321 A1    Dec. 3, 2020

Related U.S. Application Data

(63) Continuation of application No. PCT/JP2019/002546, filed on Jan. 25, 2019.

(30) Foreign Application Priority Data

Jun. 28, 2018    (JP) .................. 2018-123351

(51) Int. Cl.
G02B 27/00    (2006.01)
G03B 17/56    (2021.01)
G02B 27/64    (2006.01)

(52) U.S. Cl.
CPC ............ *G03B 17/56* (2013.01); *G02B 27/646* (2013.01); *G03B 2205/0061* (2013.01); *G03B 2205/0069* (2013.01)

(58) Field of Classification Search
CPC ... B06B 1/0207; B06B 1/0603; B06B 1/0648; B06B 1/0655; G02B 7/02; G02B 7/602;
(Continued)

(56) References Cited

U.S. PATENT DOCUMENTS 10,156,719 B2 *  12/2018  Fujimoto .................. B06B 3/02
11,511,323 B2 *  11/2022  Kitamori ................ G03B 17/08
(Continued)

FOREIGN PATENT DOCUMENTS

CN    107219709 A    9/2017
CN    107852449 A    3/2018
(Continued)

OTHER PUBLICATIONS

Official Communication issued in corresponding Chinese Patent Application No. 201980027917.1, dated Mar. 17, 2021.
(Continued)

*Primary Examiner* — Christopher P Schwartz
(74) *Attorney, Agent, or Firm* — KEATING & BENNETT, LLP

(57) ABSTRACT

A vibration device includes a cylindrical body, a light-transmissive body connected to a first end portion of the cylindrical body, and a piezoelectric element fixed to the cylindrical body. The cylindrical body includes a first flange portion extending radially outward from an outer peripheral surface, and a second flange portion. The first flange portion is located closer to the first end portion side relative to the second flange portion. The piezoelectric element is fixed to the second flange portion. By driving the piezoelectric element, the first flange portion vibrates to displace an outer peripheral edge of the first flange portion in an axial direction of the cylindrical body.

19 Claims, 10 Drawing Sheets

(58) Field of Classification Search
CPC .............. G02B 27/646; G02B 27/0006; G02B 27/11646; G03B 17/02; G03B 17/56; G03B 2205/0061; G03B 2205/0069
See application file for complete search history.

(56) References Cited

U.S. PATENT DOCUMENTS

| | | | |
|---|---|---|---|
| 2018/0095272 A1 | 4/2018 | Fujimoto et al. | |
| 2019/0033685 A1 | 1/2019 | Fujimoto et al. | |
| 2020/0038914 A1* | 2/2020 | Fujimoto | .................. G02B 7/02 |
| 2020/0379320 A1* | 12/2020 | Fujimoto | ........... G02B 27/0006 |
| 2021/0302723 A1* | 9/2021 | Fujimoto | .............. B06B 1/0603 |

FOREIGN PATENT DOCUMENTS

| | | | | |
|---|---|---|---|---|
| JP | 2012-138768 A | 7/2012 | | |
| JP | 2017-170303 A | 9/2017 | | |
| WO | 2011/078218 A1 | 6/2011 | | |
| WO | WO-2011078218 A1 * | 6/2011 | ........... B06B 1/0603 | |
| WO | 2017/022382 A1 | 2/2017 | | |
| WO | 2017/221622 A1 | 12/2017 | | |

OTHER PUBLICATIONS

Official Communication issued in International Patent Application No. PCT/JP2019/002546, dated Mar. 5, 2019.

* cited by examiner

VIBRATION DEVICE AND OPTICAL DETECTION DEVICE

CROSS REFERENCE TO RELATED APPLICATIONS

This application claims the benefit of priority to Japanese Patent Application No. 2018-123351 filed on Jun. 28, 2018 and is a Continuation Application of PCT Application No. PCT/JP2019/002546 filed on Jan. 25, 2019. The entire contents of each application are hereby incorporated herein by reference.

BACKGROUND OF THE INVENTION

1. Field of the Invention

The present invention relates to a vibration device and an optical detection device that remove droplets or the like in an imaging device or the like.

2. Description of the Related Art

In imaging devices such as cameras, LIDAR devices, or the like, it has been required to always clarify the field of view. For example, in cameras used outdoors such as in-vehicle applications, various techniques for removing water droplets such as raindrops have been proposed. In the structure described in the following International Publication No. 2017/221622, a light-transmissive portion as a cover is disposed in front of the camera body. A vibration device including the light-transmissive portion is configured. By generating a vibration localized on the light-transmissive portion, raindrops are moved and atomized. In this vibration device, a localized portion is intentionally formed in a light-transmissive portion or a peripheral portion, and an antinode of vibration is positioned in a portion other than a central portion.

In the vibration device described in International Publication No. 2017/221622, the movement and atomization of water droplets are achieved by vibrating a localized vibration unit located in a light-transmissive body or a peripheral portion thereof. However, such a structure affects an image obtained by photographing the outside through the light-transmissive body, and in a case where a localized vibration portion is present in the peripheral portion, particularly, it is necessary to increase an amplitude. When the amplitude becomes smaller, the atomization cannot be sufficiently performed. Therefore, it is necessary to increase a drive voltage, and there has been a problem in that the efficiency is low.

SUMMARY OF THE INVENTION

Preferred embodiments of the present invention provide vibration devices and optical detection devices that are each able to efficiently remove droplets and the like.

A vibration device according to a preferred embodiment of the present invention includes a cylindrical body having a radial direction and an axial direction, and having a first end portion, a second end portion located on a side opposite to the first end portion in the axial direction, and first and second flange portions extended outward from an outer peripheral surface in the radial direction, a light-transmissive body connected to the first end of the cylindrical body, and a vibration element to vibrate the first or second flange portion of the cylindrical body, in which the first flange portion is located closer to the first end portion side relative to the second flange portion in the axial direction.

An optical detection device according to a preferred embodiment of the present invention includes a vibration device and an optical detection element with a detection region included in the light-transmissive body.

According to the preferred embodiments of the present invention, vibration devices and optical detection devices are provided that are each able to efficiently remove droplets and the like.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clearly understood from the following description of preferred embodiments of the present invention with reference to the accompanying drawings.

Each of the preferred embodiments described in this specification are illustrative, and partial replacements or combinations of features, components, and elements may be provided between different preferred embodiments.

Figure 1:
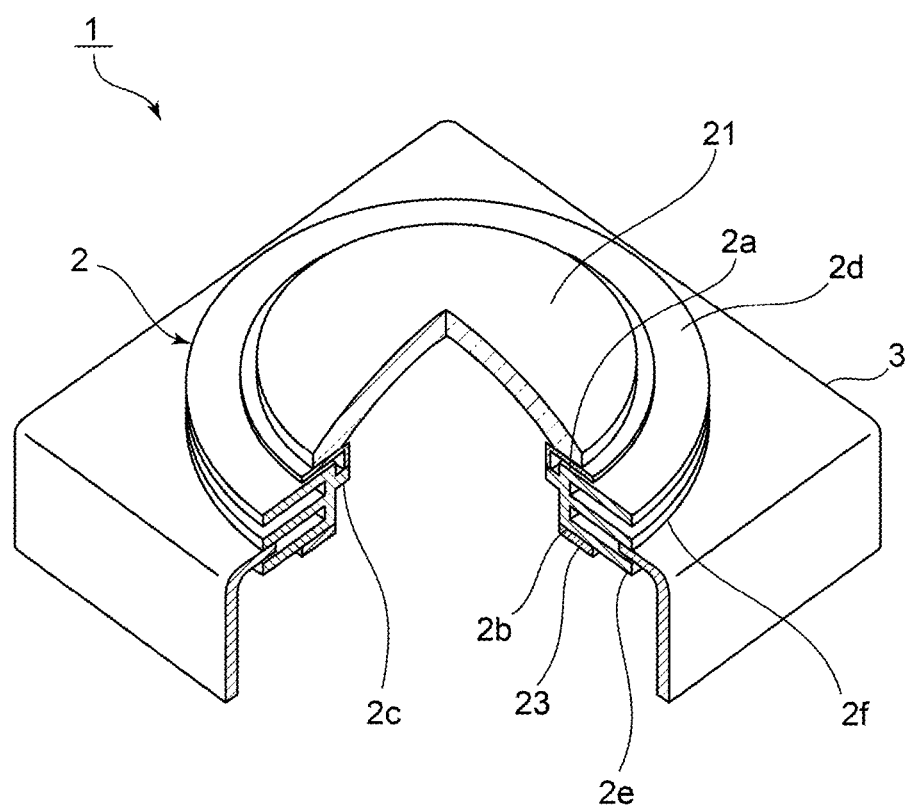
FIG. 1 is a partially cut-away perspective view of a vibration device according to a first preferred embodiment of the present invention.
Figure 2:
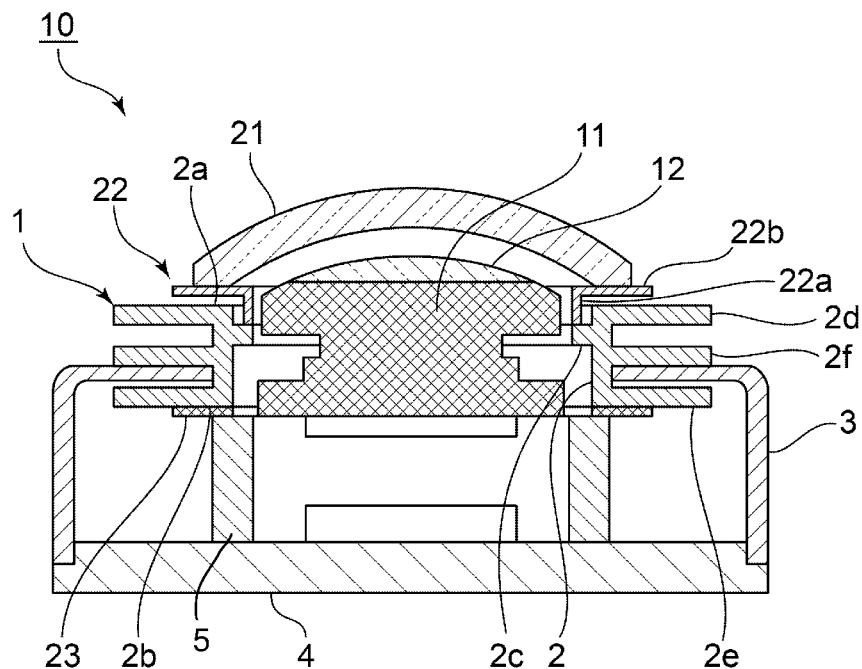
FIG. 2 is an elevational cross-sectional view of an imaging device having the vibration device according to the first preferred embodiment of the present invention.
Figure 3:
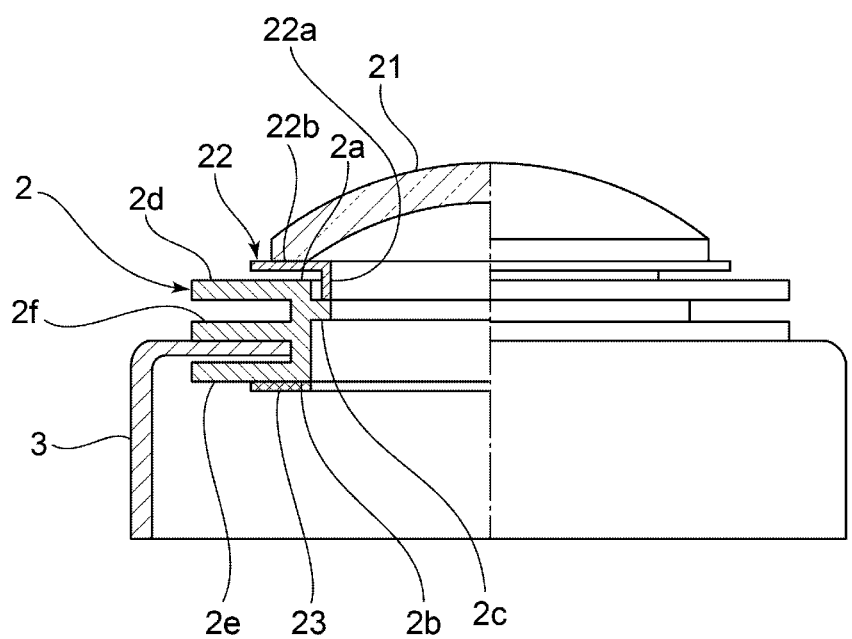
FIG. 3 is a half-sectional front view of the vibration device according to the first preferred embodiment of the present invention.

FIG. 1 is a partially cut-away perspective view of a vibration device according to a first preferred embodiment of the present invention. FIG. 2 is an elevational cross-sectional view of an imaging device including the vibration device according to the first preferred embodiment of the present invention. FIG. 3 is a half-sectional front view of the vibration device shown in FIG. 1.

An imaging device 10 shown in FIG. 2 includes a vibration device 1 and a camera 11. The camera 11 includes an imaging element. A lens 12 is located in front of the imaging element, that is, above the imaging element in FIG. 2. The imaging element is not particularly limited, and a light-receiving element that receives light having any wavelength from a visible light to a far-infrared region may be included. Examples of an imaging element include a CMOS, a CCD, a bolometer, a thermopile, and the like. Further, the imaging device 10 is not limited to the camera 11, and may be a Radar, a LIDAR device, or the like, for example.

The vibration device 1 includes a cylindrical body 2. The camera 11 and the lens 12 are located in an inner space of the cylindrical body 2.

A light-transmissive body 21 is located in front of the lens 12. The light-transmissive body 21 is made of a material that allows light and electromagnetic waves to pass therethrough. The imaging device 10 is configured to take an image of an element or an environment located at an outer side portion of the light-transmissive body 21 by the camera 11.

The light-transmissive body 21 has a dome or substantially dome shape. However, the light-transmissive body 21 may have another shape, for example, a flat plate shape or a substantially flat plate shape.

An outer peripheral edge portion of the light-transmissive body 21 is fixed to a connecting element 22. The connecting element 22 includes a tubular portion 22a and a flange portion 22b extended radially outward from one end of the tubular portion 22a. The light-transmissive body 21 is fixed to an upper surface of the flange portion 22b. A lower end of the tubular portion 22a is fixed to the cylindrical body 2.

The cylindrical body 2 has an axial direction. One end in the axial direction is a first end portion 2a, and another end is a second end portion 2b. The first end portion 2a is located on the light-transmissive body 21 side. An annular support portion 2c extended radially inward from an inner peripheral surface of the cylindrical body 2 is provided. The tubular portion 22a of the connecting element 22 is fixed to the support portion 2c. Accordingly, the light-transmissive body 21 is connected to the cylindrical body 2 by the connecting element 22. However, the support portion 2c may not have an annular shape.

The cylindrical body 2 includes a first flange portion 2d, a second flange portion 2e, and a third flange portion 2f. The first flange portion 2d, the second flange portion 2e, and the third flange portion 2f have a donut shape extended radially outward from an outer peripheral surface of the cylindrical body 2. The first flange portion 2d, the second flange portion 2e, and an outer peripheral edge of the third flange portion 2f have a circular or a substantially circular shape. In the first preferred embodiment, sizes of the circles defining the outer peripheral edges of the first to third flange portions 2d to 2f are preferably equal or substantially equal to each other. However, the outer peripheral edges of the first to third flange portions 2d to 2f are not necessarily circles having the same or substantially the same dimension.

Further, the first flange portion 2d is provided along the first end portion 2a, and the second flange portion 2e is provided along the second end portion 2b. However, the first flange portion 2d may be located closer to the second end portion 2b side in the axial direction than the first end portion 2a. The second flange portion 2e may also be located closer to the first end portion 2a side than the second end portion 2b.

The third flange portion 2f is located between the first flange portion 2d and the second flange portion 2e in the axial direction. In the first preferred embodiment, a portion between the first flange portion 2d and the second flange portion 2e defines and functions as a node of vibration. Therefore, the third flange portion 2f is preferably located at or substantially at a center between the first flange portion 2d and the second flange portion 2e, for example. However, in a case where the first flange portion 2d and the second flange portion 2e are not provided symmetrically with respect to a center in the axial direction of the cylindrical body 2, a node region of the vibration may deviate from the center of the cylindrical body 2 in the axial direction toward the first end portion 2a side or the second end portion 2b side. Accordingly, the third flange portion 2f is preferably located, for example, at a position which defines and functions as a node of the vibration. However, the third flange portion 2f does not necessarily need to be accurately located at the node of the vibration.

The support portion 2c described above is located between the first flange portion 2d and the second flange portion 2e in the axial direction. Therefore, the support portion 2c is also located adjacent to or in a vicinity of the node of the vibration.

Figure 4:
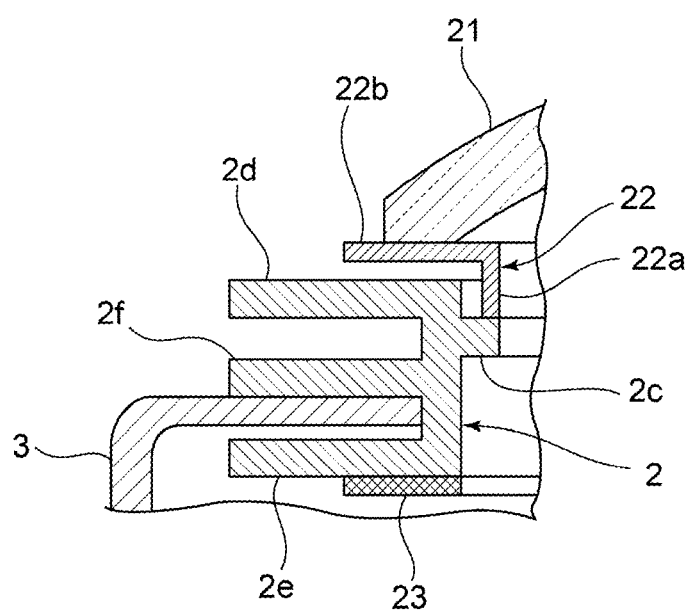
FIG. 4 is an enlarged cross-sectional view of a main portion of the vibration device according to the first preferred embodiment of the present invention.

Inner end portions of the first flange portion 2d and the second flange portion 2e are continued into the cylindrical body 2. Accordingly, as shown in FIG. 4, the cylindrical body 2, the first flange portion 2d, and the second flange portion 2e have a tuning-fork shape in a cross section taken along the radial direction and the axial direction of the cylindrical body 2. Further, when the third flange portion 2f is included, the first flange portion 2d, the second flange portion 2e, and the third flange portion 2f have the shape of a three-legged tuning-fork together with the cylindrical body 2.

Figure 5A:
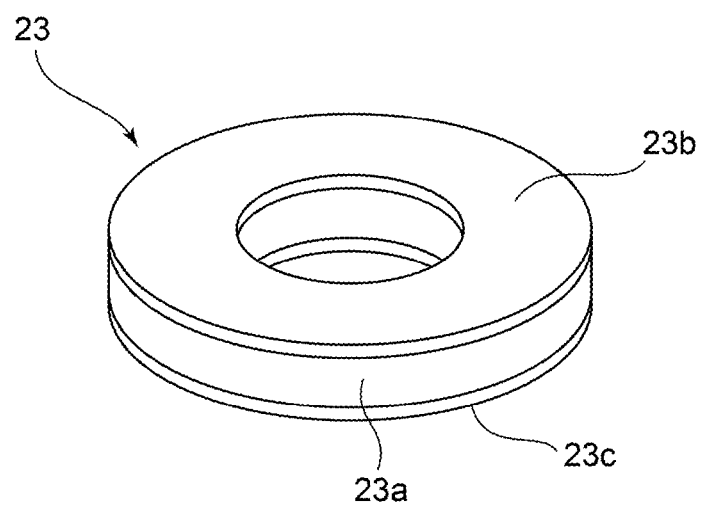
FIGS. 5A and 5B are perspective views and a front cross-sectional view showing a piezoelectric element included in the first preferred embodiment of the present invention.
Figure 5B:
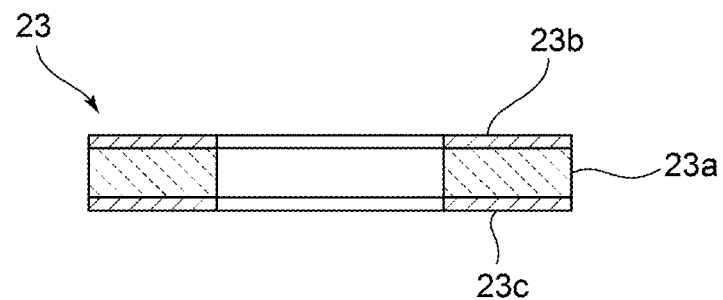

The piezoelectric element 23 is fixed to the second end portion 2b of the cylindrical body 2. As shown in FIGS. 5A and 5B, the piezoelectric element 23 includes a piezoelectric body 23a having an annular shape. A first excitation electrode 23b is provided on one surface of the piezoelectric body 23a, and a second excitation electrode 23c is provided on another surface of the piezoelectric body 23a. The piezoelectric body 23a is subjected to poling treatment in a thickness direction. When an AC voltage is applied between the first excitation electrode 23b and the second excitation electrode 23c, the piezoelectric element 23 is displaced in the thickness direction and vibrates.

The piezoelectric element 23 is fixed to a surface of the second flange portion 2e on the side of the second end portion 2b. Accordingly, when the piezoelectric element 23 vibrates, the second flange portion 2e and the first flange portion 2d vibrate in the cylindrical body 2 along with the vibration. According to this vibration, outer peripheral edges of the first flange portion 2d and the second flange portion 2e repeat the displacement along the axial direction of the cylindrical body 2.

The vibration in the first flange portion 2d is a flange-shaped unique vibration. Preferably, a resonant frequency of the vibration of the first flange portion 2d and a resonant frequency of the vibration of the second flange portion 2e are equal or substantially equal to each other, for example. In the first preferred embodiment, the resonant frequencies of both are equal or substantially equal to each other. Thus, the node of the vibration is located at a center or substantially at a center in the axial direction of the cylindrical body 2. Accordingly, the third flange portion 2f is located at the node of the vibration. Therefore, although the support 3 is fixed to the third flange portion 2f, the vibration is less likely to be hindered by this support.

Figure 6:
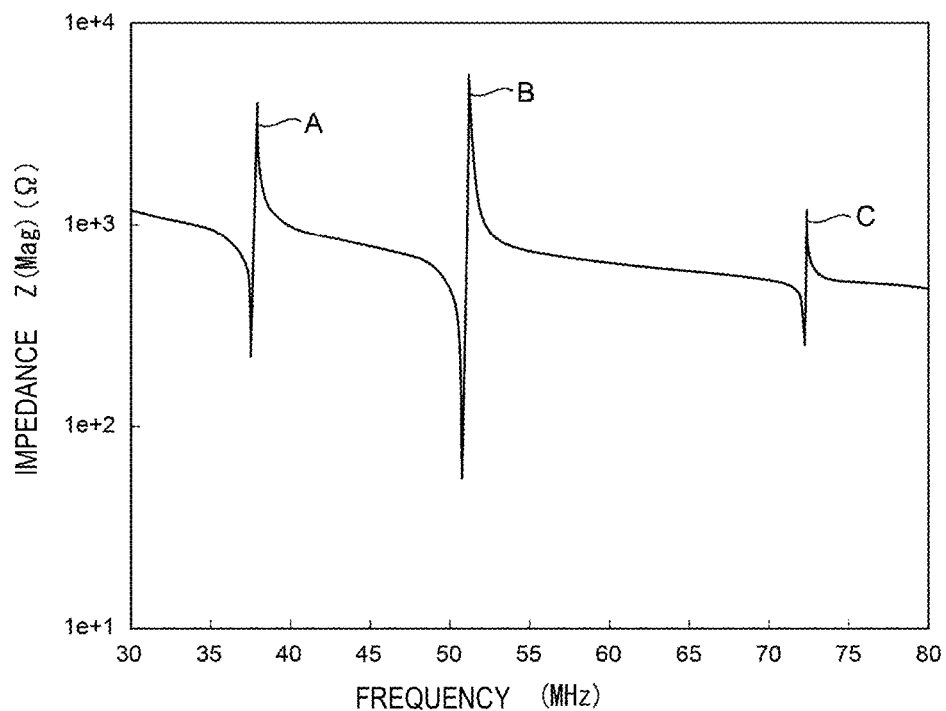
FIG. 6 is a diagram showing impedance characteristics of the vibration device according to the first preferred embodiment of the present invention.
Figure 7:
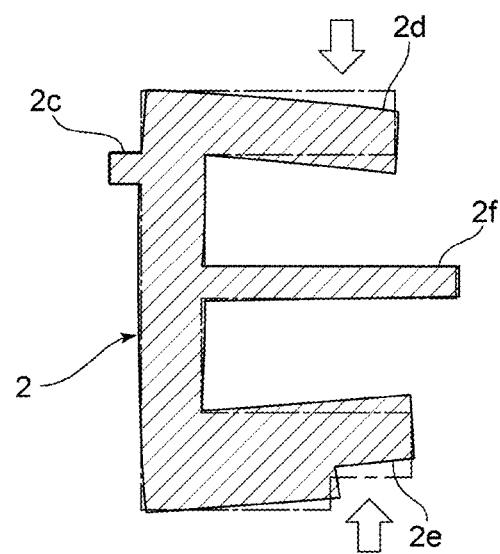
FIG. 7 shows a vibration mode of first to third flange portions in the vibration device according to the first preferred embodiment of the present invention.
Figure 8:
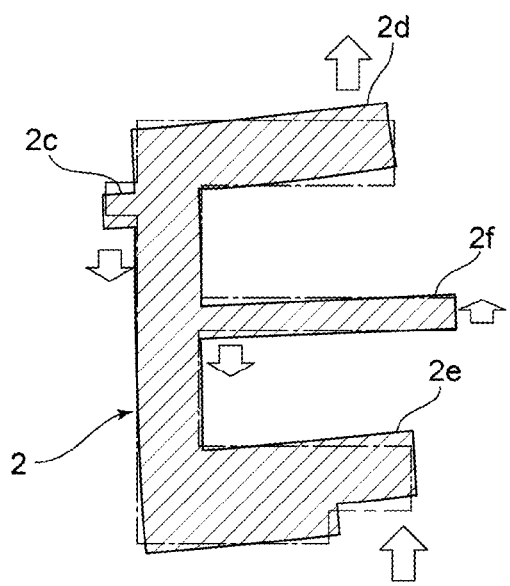
FIG. 8 shows a vibration mode of the first to third flange portions in a vibration device of a first comparative example.

FIG. 6 shows impedance characteristics in a free state of the vibration device 1 according to the first preferred embodiment. When the piezoelectric element 23 is driven, resonance indicated by A, B, and C in FIG. 6 appears. Here, the resonance in the vibration device 1 of the first preferred embodiment is a resonance A, and the vibration mode in this case is shown in FIG. 7. FIG. 7 shows a vibration mode of a cross section along the radial direction and the axial direction of the cylindrical body 2. An alternate long and short dash line indicates a mode in an initial state in which displacement does not occur, and a solid line indicates a vibration mode in a state in which the first flange portion 2d and the second flange portion 2e are maximally or substantially maximally displaced to the third flange portion 2f side. In FIG. 7 and FIG. 8, and in FIG. 10, FIG. 11, FIG. 13, and FIG. 14, which will be described later, arrows indicate the direction of displacement, and a length of the arrow corresponds to a magnitude of the displacement. In the resonance A, a tip of the first flange portion 2d and a tip of the second flange portion 2e are displaced in an opposite phase in the axial direction. Accordingly, the third flange portion 2f is hardly displaced. Therefore, the cylindrical body 2 is supported and the displacement of the first flange portion 2d is able to be efficiently utilized without inhibiting the vibration. Also, the support portion 2c is hardly displaced.

FIG. 8 is a diagram showing a vibration mode corresponding to a resonance B in FIG. 6. This vibration mode represents a vibration mode in a case where the vibration device 1 is not supported by the support 3. In FIG. 8, an alternate long and short dash line indicates a mode in a state in which no vibration occurs, and a solid line indicates a vibration mode in a state in which the first flange portion 2d and the second flange portion 2e are displaced at a maximum or substantially at a maximum. As shown in FIG. 8, in the resonance B, the tip of the first flange portion 2d and the tip of the second flange portion 2e vibrate in phase with each other in the axial direction. The resonance B has a response larger than that of the resonance A. However, the third flange portion 2f is largely displaced as shown in FIG. 8. Therefore, in a case where the third flange portion 2f is connected to the support 3, the vibration of the cylindrical body 2 is inhibited. More specifically, in a case where the support is provided by the support 3, vibration is braked due to the fixation of the third flange portion 2f even when resonance occurs by the piezoelectric effect. Accordingly, an amplitude of the first flange portion 2d is also significantly reduced. Accordingly, the clear resonance B shown in FIG. 6 greatly varies due to the fixation, and hardly appears or becomes unstable. Therefore, the large resonance B shown in FIG. 6 is not actually provided.

As shown in FIG. 1 to FIG. 8, in the vibration device 1, the first flange portion 2d vibrates and the outer peripheral edge of the first flange portion 2d is displaced along the axial direction of the cylindrical body 2.

The light-transmissive body 21 is fixed to the cylindrical body 2 with the connecting element 22 located between the light-transmissive body 21 and the cylindrical body 2. Accordingly, the support portion 2c is located adjacent to or in a vicinity of the node of the vibration.

In the vibration device 1, the droplets that reach the first flange portion 2d through the flange portion 22b of the connecting element 22 from the light-transmissive body 21 are scattered or atomized to the outside of the first flange portion 2d by the vibration of the first flange portion 2d.

Preferably, a surface of the light-transmissive body 21 is hydrophilic, for example. That is, a hydrophilic film may be provided on the surface of the light-transmissive body 21, and the light-transmissive body 21 may be made of a hydrophilic material. Accordingly, the droplets adhering to the outer surface of the light-transmissive body 21 move more quickly toward the first flange portion 2d side.

In the vibration device 1 of the first preferred embodiment, the light-transmissive body 21 may not be vibrated. Accordingly, the light-transmissive body 21 may be made of a non-resonant material, for example, plastic. Therefore, in the vibration device 1, the degree of freedom in designing the optical system is able to be significantly increased. However, the light-transmissive body 21 may be made of a material having a resonant property.

As described above, in the first flange portion 2d in the vibration device 1 of the first preferred embodiment, the moved droplets are able to be scattered out of the first flange portion 2d and atomized. Therefore, in the vibration device 1, a driving efficiency is able to be significantly improved, and the droplets are able to be removed at a lower voltage.

In addition, in the vibration device 1, the camera 11 or the like is located inside the cylindrical body 2, however, the inside is able to be sealed by the connecting element 22 and the light-transmissive body 21 on the first end portion 2*a* side of the cylindrical body 2. Further, the support from the outside may be provided by, for example, the support 3 on the outer peripheral surface side of the cylindrical body 2. The cylindrical support 3 has a central axis that is coaxial or substantially coaxial with a central axis of the cylindrical body 2. The support 3 covers the outer peripheral surface side of a portion of another end side of the cylindrical body 2, and is extended to the axially outer side of the cylindrical body 2. One end side of the cylindrical support 3 includes a flat plate portion that extends inward in the radial direction, and an opening is provided in the center or substantially in the center of the flat plate portion. An upper surface on the opening side of the flat plate portion extends along a circumferential direction of a lower surface of the third flange portion 2*f*, and supports the third flange portion 2*f*. Another end of the cylindrical support 3 is sealed by the base plate 4, and the leg portions 5 are located between the base plate 4 and the piezoelectric element 23. Accordingly, the inside of the cylindrical body 2 is easily able to be sealed. Thus, an inside of the imaging device 10 is able to be sealed by the tubular support 3 and the base plate 4. Therefore, the camera 11, the imaging element including the camera 11, circuits to drive these elements, the piezoelectric element 23, and the like are able to be shielded from the outside. Accordingly, the reliability and environmental resistance characteristics of the imaging device 10 are also able to be significantly improved.

In the vibration device of the first preferred embodiment, one third flange portion 2f is provided between the first flange portion 2d and the second flange portion 2e, however, a plurality of third flange portions 2f may be provided.

Figure 9:
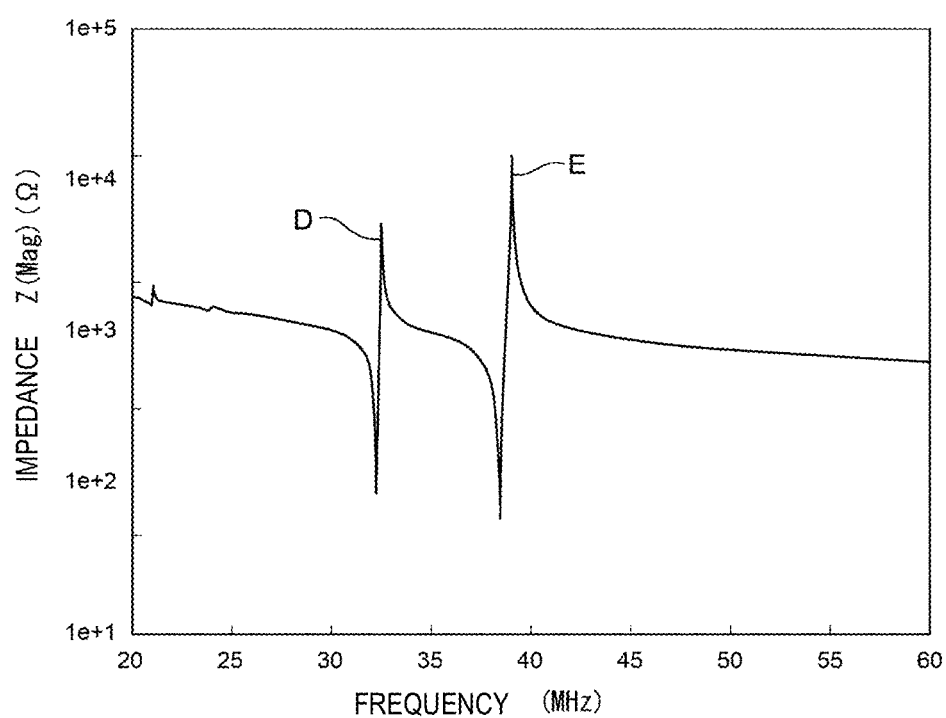
FIG. 9 is a diagram showing impedance characteristics of a vibration device according to a second preferred embodiment of the present invention.
Figure 10:
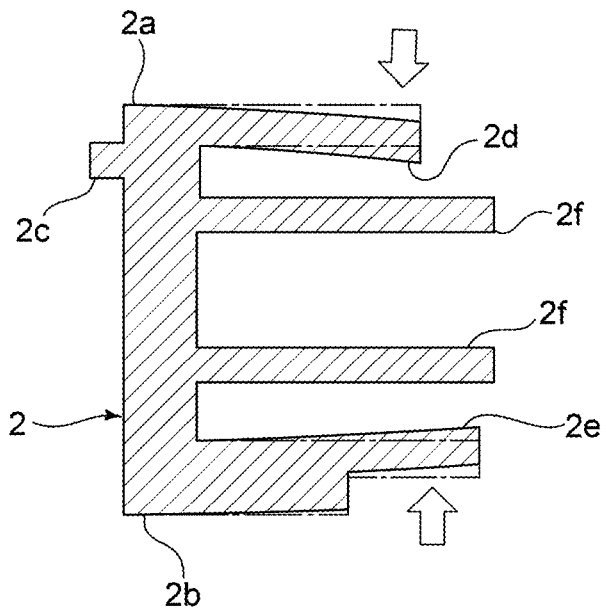
FIG. 10 shows a vibration mode of first to third flange portions in the vibration device according to the second preferred embodiment of the present invention.

In a vibration device according to a second preferred embodiment of the present invention, two third flange portions 2f are provided. FIG. 9 shows an impedance characteristic of the vibration device according to the second preferred embodiment. FIG. 9 shows impedance characteristics in a state in which no support at the outside is provided by the support. In FIG. 9, a resonance D and a resonance E appear on the impedance characteristics. The resonance D is the resonance that is included in the second preferred embodiment. FIG. 10 shows a vibration mode in a cross section along the radial direction and the axial direction of the cylindrical body in the vibration device according to the second preferred embodiment. An alternate long and short dash line indicates a mode in a state in which no vibration occurs, and a solid line indicates a vibration mode in a maximum or substantially maximum displacement state. The tip of the first flange portion 2d and the tip of the second flange portion 2e vibrate in the opposite phase in the axial direction of the cylindrical body 2. As shown in FIG. 10, in this case, the third flange portions 2f and 2f do not vibrate. Therefore, the support from the outside may be provided by any one of the third flange portions 2f and 2f. Alternatively, both of the third flange portions 2f and 2f may be connected to the outside.

Also, the support portion 2c is not displaced. Therefore, the first flange portion 2d is able to be vibrated without vibrating the light-transmissive body 21.

Figure 11:
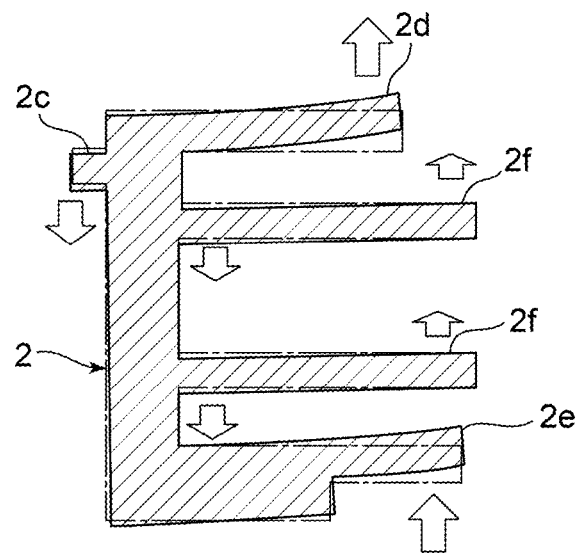
FIG. 11 shows a vibration mode of first to third flange portions in a vibration device according to a second comparative example.

FIG. 11 is a diagram showing a vibration mode in a case where the cylindrical body 2 vibrates at the resonance E in FIG. 9. Here, the tip of the first flange portion 2d is largely displaced, and the tip of the second flange portion 2e is largely displaced. However, the third flange portions 2f and 2f and the support portion 2c are displaced as shown in the drawings. Therefore, in a case where actually the support from the outside is provided by the third flange portions 2f and 2f, vibration in the cylindrical body 2 is braked, and a large amplitude is not able to be provided.

Figure 12:
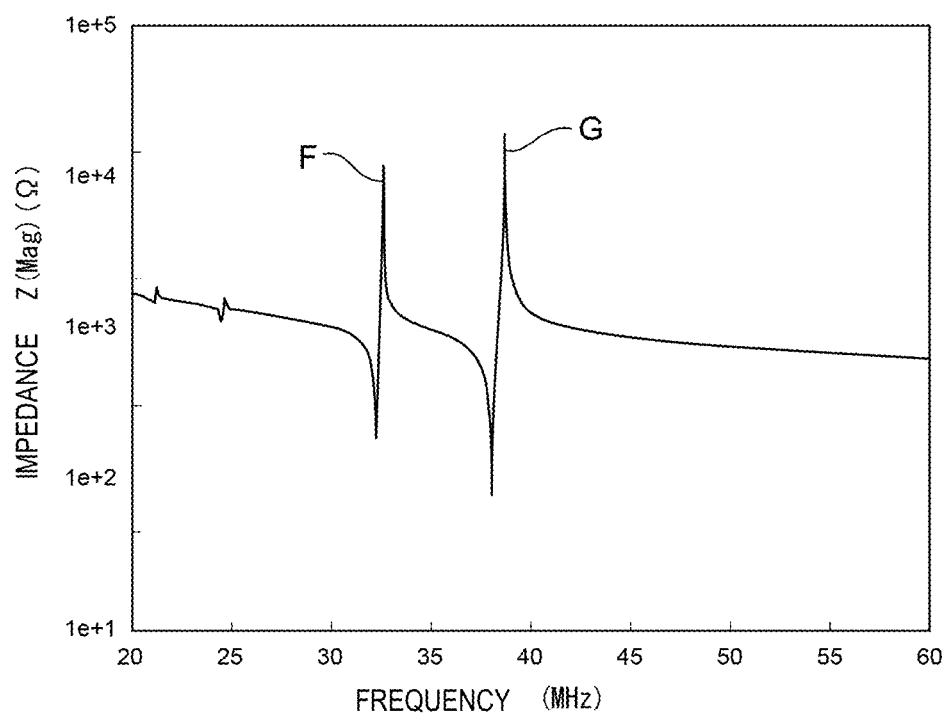
FIG. 12 is a diagram showing impedance characteristics of a vibration device according to a third preferred embodiment of the present invention.
Figure 13:
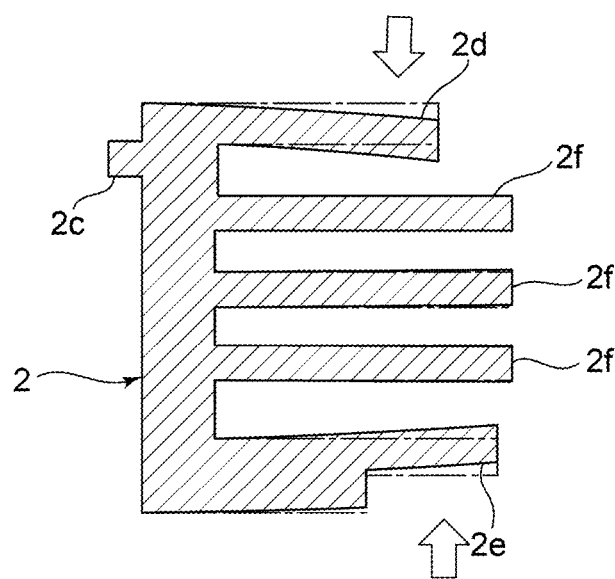
FIG. 13 shows a vibration mode of first to third flange portions in the vibration device according to the third preferred embodiment of the present invention.

In a vibration device according to a third preferred embodiment of the present invention, three sheets of third flange portions 2f are provided. FIG. 12 shows an impedance characteristic of the vibration device according to the third preferred embodiment. FIG. 12 shows impedance characteristics in a state in which support at the outside is not provided by the support. In FIG. 12, the resonance F and the resonance G appear on the impedance characteristics. Resonance F is the resonance used in the third preferred embodiment. FIG. 13 shows a vibration mode in a cross section along the radial direction and the axial direction of the cylindrical body in the vibration device according to the third preferred embodiment. An alternate long and short dash line indicates a mode in a state in which no vibration occurs, and a solid line indicates a vibration mode in a maximum or substantially maximum displacement state. The tip of the first flange portion 2d and the tip of the second flange portion 2e vibrate in the opposite phase in the axial direction of the cylindrical body 2. As shown in FIG. 13, in this case, the third flange portions 2f, 2f, and 2f do not vibrate. Thus, it will be sufficient that the support from the outside is provided by any one of the third flange portions 2f, 2f, and 2f. Alternatively, all of the third flange portions 2f, 2f, and 2f may be connected to the outside.

Also, the support portion 2c is not displaced. Therefore, the first flange portion 2d is able to be vibrated without vibrating the light-transmissive body 21.

Figure 14:
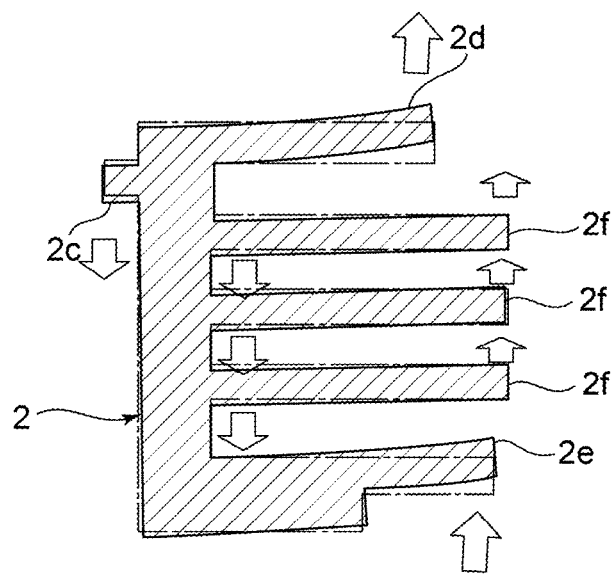
FIG. 14 shows a vibration mode of first to third flange portions in a vibration device according to a third comparative example.

FIG. 14 is a diagram showing a vibration mode in a case where the cylindrical body 2 vibrates at the resonance G in FIG. 12. Here, the tip of the first flange portion 2d is largely displaced and the tip of the second flange portion 2e is also largely displaced. However, the third flange portions 2f, 2f, and 2f and the support portion 2c are displaced as shown in the figure. Therefore, in a case where actually the support from the outside is performed by the third flange portions 2f, 2f, and 2f, the vibration is braked, and thus a large magnitude of the vibration is not able to be provided.

In the second preferred embodiment described above, the shape of a four-legged tuning-fork is provided in the cross section along the radial direction and the axial direction of the cylindrical body 2. In addition, in the third preferred embodiment, the shape of a five-legged tuning-fork is provided. As described above, the tuning-fork shaped cross section defined by the cylindrical body 2 and the first to third flange portions 2d to 2f is not particularly limited. That is, the shape may have two legs, may have three legs, may have four legs, or may have equal to or more than five legs. At least the first flange portion 2d and the second flange portion 2e may be provided on the outer peripheral surface of the cylindrical body 2. It is sufficient that the cylindrical body 2 has a tuning-fork shape having equal to or more than two legs in a cross section, and has an outer shape defined by rotating the cross-sectional tuning-fork shape having the equal to or more than two legs with respect to the central axis of the cylindrical body 2.

However, at least one third flange portion 2f is preferably provided, for example. Accordingly, the support is able to be easily provided from the outside. Further, as described above, a plurality of third flange portions 2f may be provided.

Further, the first flange portion 2d is preferably located at the first end portion 2a, and the second flange portion 2e is preferably located at the second end portion 2b, for example. Accordingly, the first flange portion 2d is able to be easily displaced with a larger amplitude.

The light-transmissive body 21 is connected to the cylindrical body 2 with the connecting element 22 located between the light-transmissive body 21 and the cylindrical body 2. Accordingly, the connecting element 22 is fixed to the inner peripheral surface of the cylindrical body 2, and the light-transmissive body 21 is connected to the cylindrical body 2. The connecting portion is not particularly limited. However, the connecting portion is preferably located on the first end portion 2a side relative to the second end portion 2b on the inner peripheral surface of the cylindrical body 2, for example.

Further, the resonant frequency of the first flange portion 2d and the resonant frequency of the second flange portion 2e are preferably equal or substantially equal to each other, for example. Accordingly, the displacement of the third flange portion 2f is able to be further significantly reduced. Therefore, the materials and dimensions of the first flange portion 2d and the second flange portion 2e are preferably equal or substantially equal to each other, for example, to match the resonant frequencies of the first flange portion 2d and the second flange portion 2e. However, the materials and the dimensions of the first flange portion 2d and the second flange portion 2e may be different from each other as long as the resonant frequencies are matched.

Figure 15:
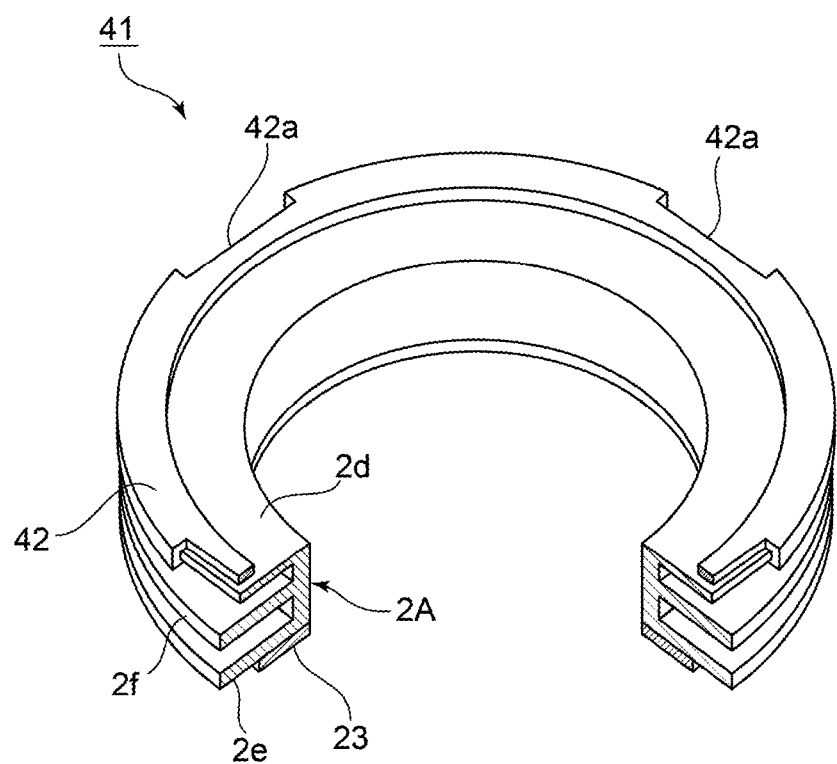
FIG. 15 is a partially cut-away perspective view showing a vibration device according to a fourth preferred embodiment of the present invention.

FIG. 15 is a partially cut-away perspective view showing a vibration device according to a fourth preferred embodiment of the present invention. A vibration device 41 has a cylindrical body 2A. Similar to the first preferred embodiment, the cylindrical body 2A has first to third flange portions 2d to 2f. The piezoelectric element 23 is fixed to the surface of the second flange portion 2e on the second end portion 2b side. The fourth preferred embodiment is different from the first preferred embodiment in that a folded portion 42 folded back from the outer peripheral edge of the first flange portion 2d inward in the radial direction is provided in the cylindrical body 2A. The folded portion 42 has a substantially donut shape in a plan view. The folded portion 42 faces a surface of the first flange portion 2d on the side opposite to the second flange portion 2e side with a space therebetween. By providing the folded portion 42, the displacement of the first flange portion 2d in the axial direction of the cylindrical body 2A is able to be further significantly increased. Therefore, the droplets are able to be more effectively removed.

A portion of the folded portion 42, the portion facing the first flange portion 2d, is preferably extended in parallel or substantially in parallel to the first flange portion 2d, for example.

Further, the folded portion 42 is provided with a plurality of cutouts 42a along the circumferential direction of the folded portion 42. When the cutout 42a is provided, the liquid droplets that reach the space between the first flange portion 2d and the folded portion 42 are able to be quickly discharged to the outside. However, the cutout 42a may be omitted.

Figure 16:
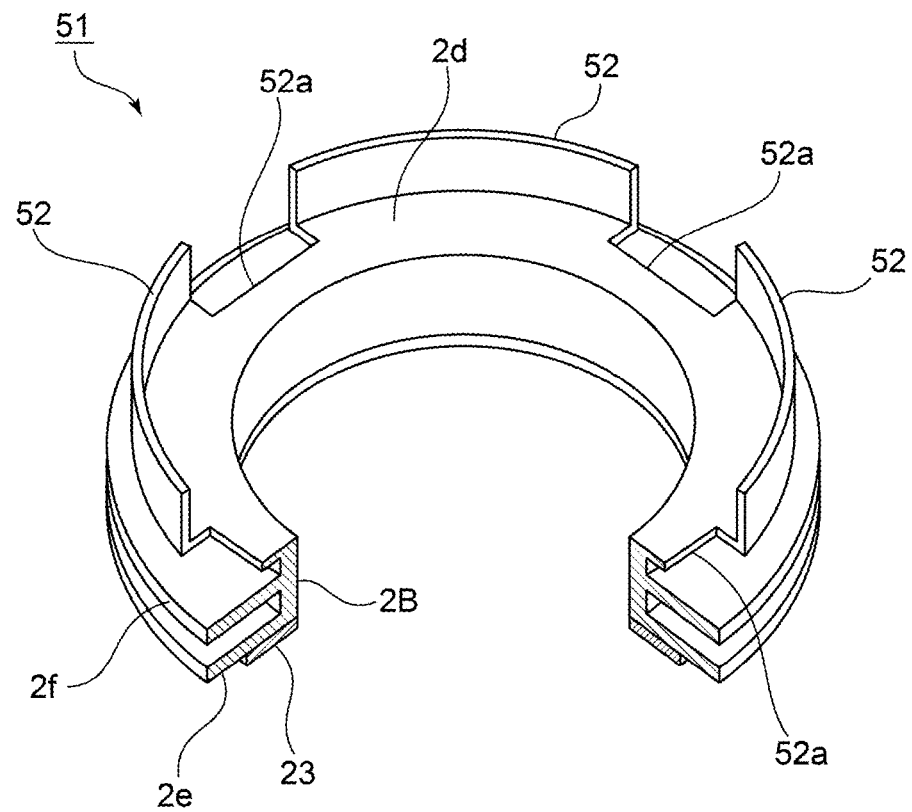
FIG. 16 is a partially cut-away perspective view showing a vibration device according to a fifth preferred embodiment of the present invention.

FIG. 16 is a partially cut-away perspective view showing a vibration device according to a fifth preferred embodiment of the present invention. In a vibration device 51, in a cylindrical body 2B, wall portions 52, 52, and 52 extended from the outer peripheral edge of the first flange portion 2d in the axial direction of the cylindrical body 2B in a direction away from the second flange portion 2e are provided. Here, although the plurality of wall portions 52, 52, and 52 are provided, a tubular wall portion extended in the axial direction of the cylindrical body 2B may be provided from the entire outer peripheral edge of the first flange portion 2d. In the fifth preferred embodiment, the plurality of wall portions 52, 52, and 52 are extended in parallel or substantially in parallel to the axial direction of the cylindrical body 2B. A portion between the adjacent wall portions 52 is defined as a cutout 52a. When the cutout 52a is provided, the droplets adhering on the first flange portion 2d are quickly discharged from the cutout 52a to the outside.

Figure 17:
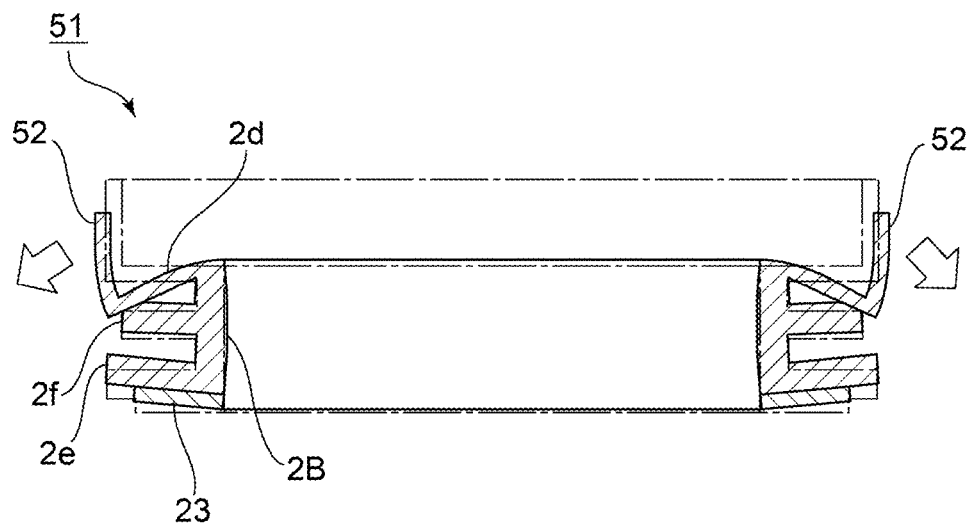
FIG. 17 is a cross-sectional view showing a vibration mode of the vibration device according to the fifth preferred embodiment of the present invention.

FIG. 17 is a cross-sectional view showing a vibration mode in the vibration device 51. Also in FIG. 17, the arrows indicate the direction of the displacement and the magnitude of the displacement. Since the wall portion 52 is provided, in a case where the cylindrical body 2B is vibrated, when the outer peripheral edge of the first flange portion 2d is displaced in the axial direction, an axial end portion of the cylindrical body 2B of the wall portion 52, which is an upper end in FIG. 16, is largely displaced in the radial direction. Therefore, since the amplitude is able to be increased, the droplets are able to be more effectively removed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vibration device comprising:
   a cylindrical body having a radial direction and an axial direction, and including a first end portion, a second end portion located on a side opposite to the first end portion in the axial direction, and first and second flange portions extending outward from an outer peripheral surface in the radial direction;
   a light-transmissive body connected to the first end of the cylindrical body; and
   a vibration element to vibrate the first flange portion or the second flange portion of the cylindrical body; wherein
   the first flange portion is located closer to the first end portion side relative to the second flange portion in the axial direction;
   the vibration element is fixed to the second flange portion; and
   the first flange portion vibrates to displace an outer peripheral edge of the first flange portion in the axial direction by driving the vibration element.

2. The vibration device according to claim 1, wherein a third flange portion is provided between the first flange portion and the second flange portion on an outer peripheral surface of the cylindrical body.

3. The vibration device according to claim 2, wherein a plurality of the third flange portions are provided.

4. The vibration device according to claim 2, further comprising:
   a support connected to the third flange portion; wherein
   the support supports the cylindrical body at an exterior of the cylindrical body.

5. The vibration device according to claim 1, wherein a wall portion extending from the outer peripheral edge of the first flange portion in a direction away from the second flange portion is provided.

6. The vibration device according to claim 5, wherein the wall portion extends in parallel or substantially in parallel to the axial direction.

7. The vibration device according to claim 5, wherein a plurality of the wall portions are provided along the outer peripheral edge of the first flange portion, and a cutout is provided between the plurality of wall portions.

8. The vibration device according to claim 5, wherein the wall portion is a tubular portion continuing to the outer peripheral edge of the first flange portion.

9. The vibration device according to claim 1, wherein the vibration element is a piezoelectric element.

10. The vibration device according to claim 9, wherein the piezoelectric element is fixed to the cylindrical body.

11. The vibration device according to claim 1, wherein the first flange portion and the second flange portion are displaced in an opposite phase to each other.

12. The vibration device according to claim 11, wherein a resonant frequency of the first flange portion is equal or substantially equal to a resonant frequency of the second flange portion.

13. The vibration device according to claim 1, wherein a folded portion that is folded back inward in the radial direction from the outer peripheral edge of the first flange portion is provided.

14. The vibration device according to claim 13, wherein a cutout is provided in an outer peripheral edge of the folded portion.

15. The vibration device according to claim 1, wherein the first flange portion is located at the first end portion, and the second flange portion is located at the second end portion.

16. The vibration device according to claim 1, wherein the light-transmissive body is connected to an inner peripheral surface of the cylindrical body at a position between the first flange portion and the second flange portion.

17. The vibration device according to claim 1, wherein an outer periphery of the first flange portion and the second flange portion has a circular or a substantially circular shape.

18. An optical detection device comprising: the vibration device according to claim 1.

19. The vibration device according to claim 1, further comprising:
- a connecting element including a tubular portion and a fourth flange portion extended radially outward from one end of the tubular portion; wherein
- the light-transmissive body is fixed to an upper surface of the fourth flange portion; and
- a lower surface of the tubular portion is fixed to the first end of the cylindrical body.

* * * * *